(12) United States Patent
Lee

(10) Patent No.: US 6,243,401 B1
(45) Date of Patent: Jun. 5, 2001

(54) METHODS AND APPARATUS FOR WAVELENGTH MEASUREMENT AND TRACKING USING A SEMICONDUCTOR LASER AMPLIFIER

(75) Inventor: San-Liang Lee, Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/248,198

(22) Filed: Feb. 10, 1999

(51) Int. Cl.[7] ............................................ H01S 3/10
(52) U.S. Cl. .......................... 372/20; 372/22; 372/26; 372/29; 372/32; 372/43
(58) Field of Search ......................... 372/19, 20, 21, 372/22, 23, 26, 28, 29, 32, 43, 50

(56) References Cited

U.S. PATENT DOCUMENTS

| | | | |
|---|---|---|---|
| 5,048,031 | * 9/1991 | Thonn | 372/33 |
| 5,068,864 | * 11/1991 | Javan | 372/32 |
| 5,103,453 | * 4/1992 | Kebabian et al. | 372/20 |
| 5,107,509 | * 4/1992 | Esterowitz et al. | 372/20 |
| 5,373,515 | * 12/1994 | Wakabayashi et al. | 372/20 |
| 6,034,976 | * 3/2000 | Mossberg et al. | 372/32 |

* cited by examiner

Primary Examiner—Brian Healy
(74) Attorney, Agent, or Firm—Robert L. Shaver; Frank J. Dykas

(57) ABSTRACT

This invention demonstrates the methods that use semiconductor laser amplifier (SLA) as a wavelength discriminator, as well as several apparatus designed using these methods. The functions of the invented apparatus include wavelength measurement, wavelength tracking, wavelength comparison, and wavelength stabilization and control of lasers. The key concept for which these methods and apparatus work is the variation of the transparent current of a SLA with the wavelength of an incident light. The transparent current of a SLA can be easily detected from the induced voltage across the diode junction when the incident light is intensity-modulated. The incident wavelength can be accurately determined by measuring the transparent current. These methods and apparatus are expected to be very useful in wavelength display for photonic instruments, wavelength control and wavelength registration for photonic networks, and wavelength stabilization for laser diodes. Since the SLA can be monolithically integrated with semiconductor lasers.

23 Claims, 8 Drawing Sheets

Figure 1:
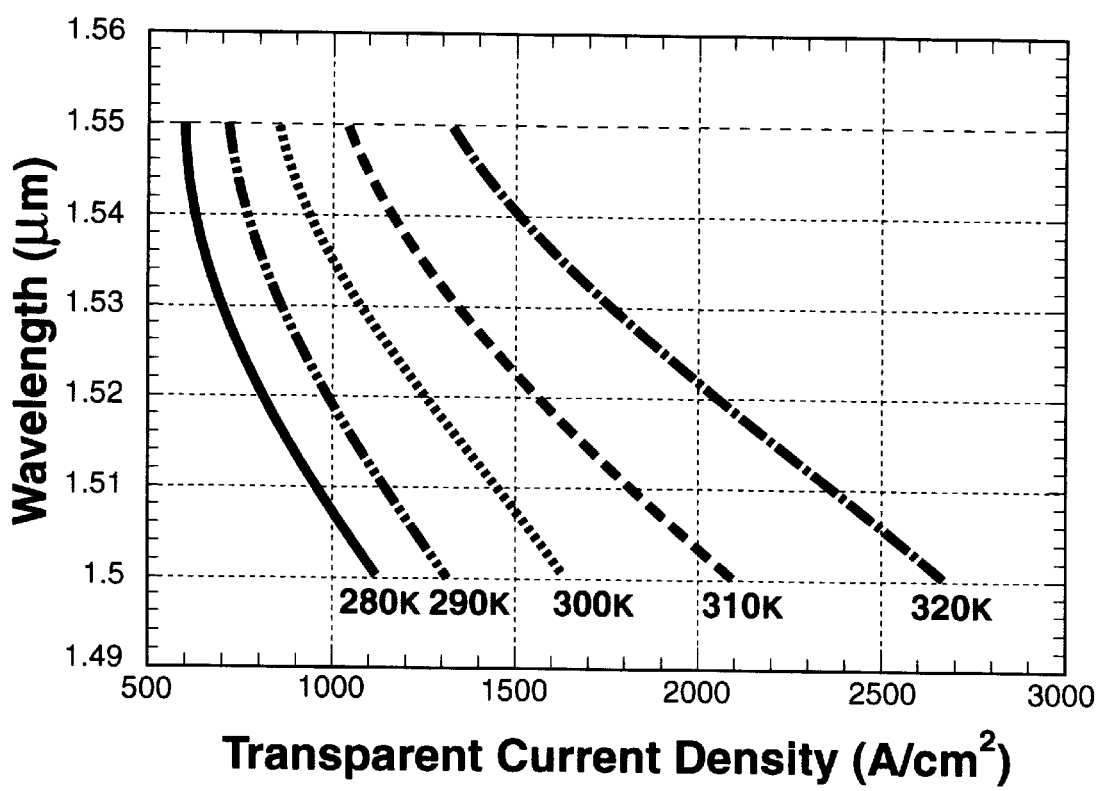

METHODS AND APPARATUS FOR WAVELENGTH MEASUREMENT AND TRACKING USING A SEMICONDUCTOR LASER AMPLIFIER

BACKGROUND OF THE INVENTION

1. Field of the Invention

The present invention demonstrates the method of wavelength measurement and tracking by using a semiconductor laser amplifier.

2. Description of the Prior Art

With the flourishing development of computer and the rapid growth of internet applications, people have higher demand on the channel bandwidth for data transmission. Since optical fiber has advantages of wide bandwidth and low loss, it has become the main medium of network transmission. In response to the rapid growth of the channel capacity in communication networks, ITU has established the standard for multi-wavelength (frequency) optical networks, and various wavelength multiplexing devices and technology are developed rapidly. The key point of these devices and technology lies in the control and stabilization of the wavelength of lasers. Therefore, an economic and effective method of wavelength control and stabilization will make a significant contribution to the development of optical networks.

So far, single frequency lasers and tunable wavelength lasers for high speed optical networks and telecommunications have already been mass produced. With the reduction of cost, the application of these laser sources is growing very fast. Since wavelength is the critical resource of an optical fiber network, its measurement and control becomes an important issue. The error in wavelength display or measurement of electro-optic instruments is typically about 0.5 nm. However, the channel spacing of WDM networks is as small as 0.8 nm, so the accuracy of laser wavelength and its stability must be on the order of 0.1 nm or better.

The current technology for the applications of the following devices is described below:

(1) wavelength measurement or sensing: an electro-optic mechanism which is wavelength sensitive should be used in measuring the wavelength. Interferometry is the most frequently used mechanism for wavelength measurement, e.g., in U.S. Pat. No. 5,392,120 and U.S. Pat. No. 5,493,395, interferometers are used as the main component in wavelength measurement, in which the wavelength dependency of the combined signal formed by the optical path length difference between different routes or multiple reflections was utilized to distinguish the wavelength. In general, the accuracy of wavelength measuring instrument can be as high as 1 ppm. Adding a reference laser beam with stable and accurate wavelength can greatly increase the measurement accuracy. Besides, T. Coroy et al. mentioned the method of wavelength measurement using the photodetector with optical filter in *IEEE photonics technology Letters* (vol. 8, no. 12, pp. 1686–1688, 1996).

(2) Wavelength tracking and wavelength stabilization: Interferometers with special feedback control circuit for wavelength measurement are usually used to match a special position in the output characteristics of the interferometer (e.g. its peak value) with the wavelength of incident light. To stabilize the wavelength, the feedback control circuit and reference beam with stable and sensitive wavelength characteristics is used. Several frequently used methods are described in the book "Frequency Stabilization of Semiconductor Laser Diodes" written by Ikegami et al. (1995) The components or approach to generate or serve as the reference wavelength are:

(i) Interferometer with fixed wavelength characteristics.

(ii) Optical fiber grating with sharp transmission spectrum.

(iii) Specific spectral lines (e.g. Na, Rb, Cs, etc.) from the energy level transition of metal atoms.

(iv) Optogalvanic effect: Certain gas lamp will change its electric property under the light illumination at some specific wavelength (e.g. Kr, at 1.524380 ?m).

v) Gas unit with a specific absorption wavelength.

(3) Wavelength comparison: few methods are proposed in this respect, so far only M. Guy et al. mentioned a wavelength comparator by applying the nonlinear effect of optical waveguide with photodetector array in *Journal of Lightwave Technology* (Vol. 14, No.6, pp. 1136–1143, 1996 ), in which the diffraction angle varies with different wavelength and thus the wavelength of the incident light can be compared.

Additional objects, advantages and novel features of the invention will be set forth in part in the description as follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

To resolve the said problems of the precision and stability of WDM light sources, the present invention demonstrates the methods that use semiconductor laser amplifier (SLA) for wavelength discrimination, as well as several apparatus designed using these methods. The method of the present invention is simple and economic in wavelength measurement and control. Its accuracy can be better than 10 GHz (i.e. 0.08 nm in 1.55 mm fiber window) which meets the specification of dense WDM network.

Since the SLA of the present invention can be monolithically integrated with the laser to be measured or controlled, the packaging cost can be reduced and the reliability of the applied apparatus can be greatly improved.

Also, another advantage of the present invention is: since the SLA operates only near the transparent current, it is unnecessary to have high quality antireflection coating on its facets, hence the cost of manufacturing lasers with stable wavelength can be greatly reduced, which again makes the WDM network more feasible.

Furthermore, since the cost of wavelength measurement and display is reduced by the present invention, the cost of related optoelectronic instruments is reduced, too.

Still other objects and advantages of the present invention will become readily apparent to those skilled in this art from the following detailed description wherein I have shown and described only the preferred embodiment of the invention, simply by way of illustration of the best mode contemplated by carrying out my invention. As will be realized, the invention is capable of modification in various obvious respects all without departing from the invention. Accordingly, the drawings and description of the preferred embodiment are to be regarded as illustrative in nature, and not as restrictive.

BRIEF DESCRIPTION OF THE INVENTION

FIG. 1: The relation of the transparent current with the wavelength and temperature of InGaAsP material (energy gap 0.8 eV).

Figure 2:
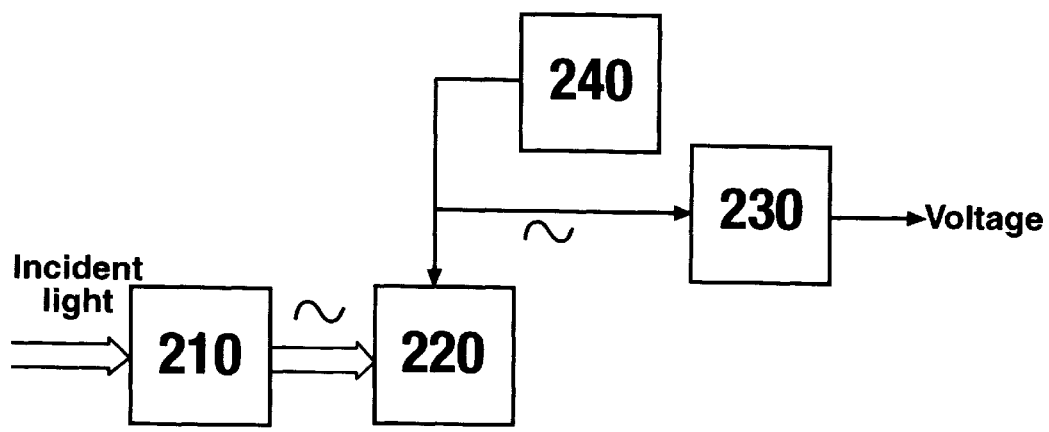

FIG. 2: The block diagram of the structure of the prior technology to measure the transparent current.

Figure 3:
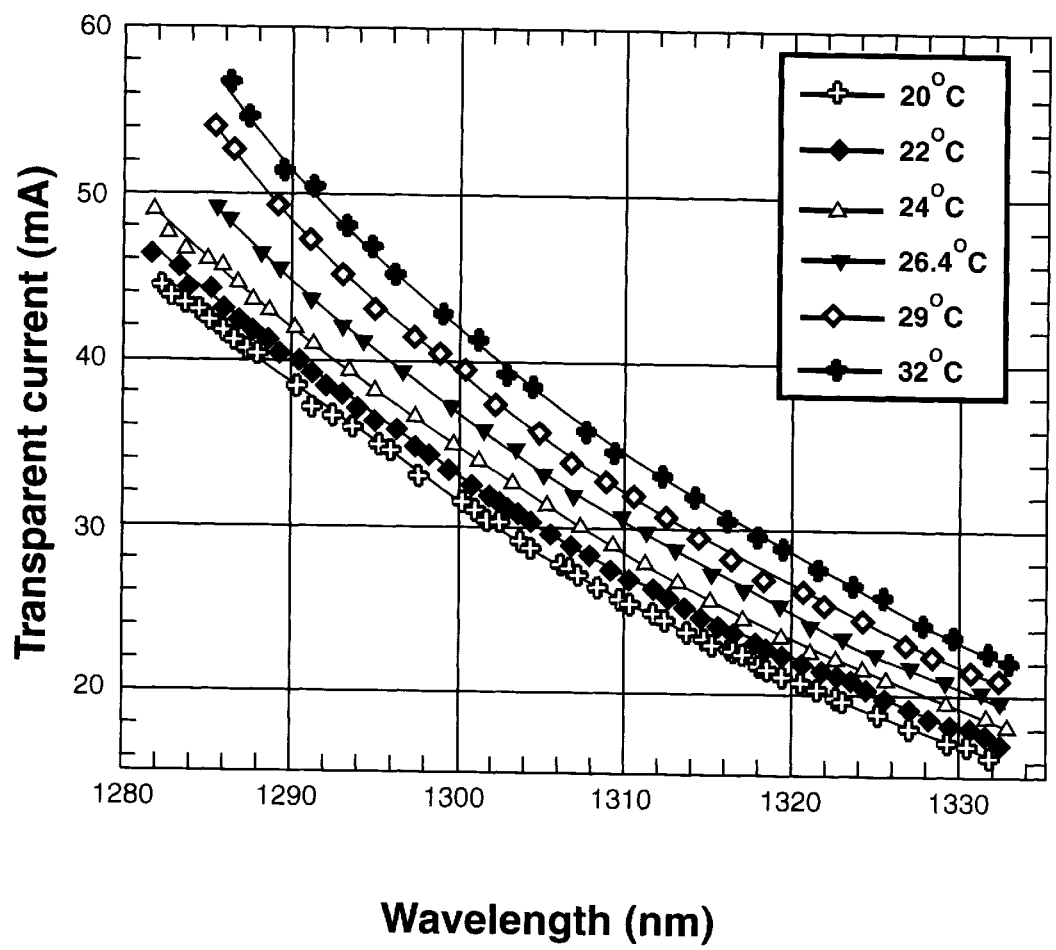

FIG. 3: The relation of the transparent current with measured wavelength and temperature.

Figure 4:
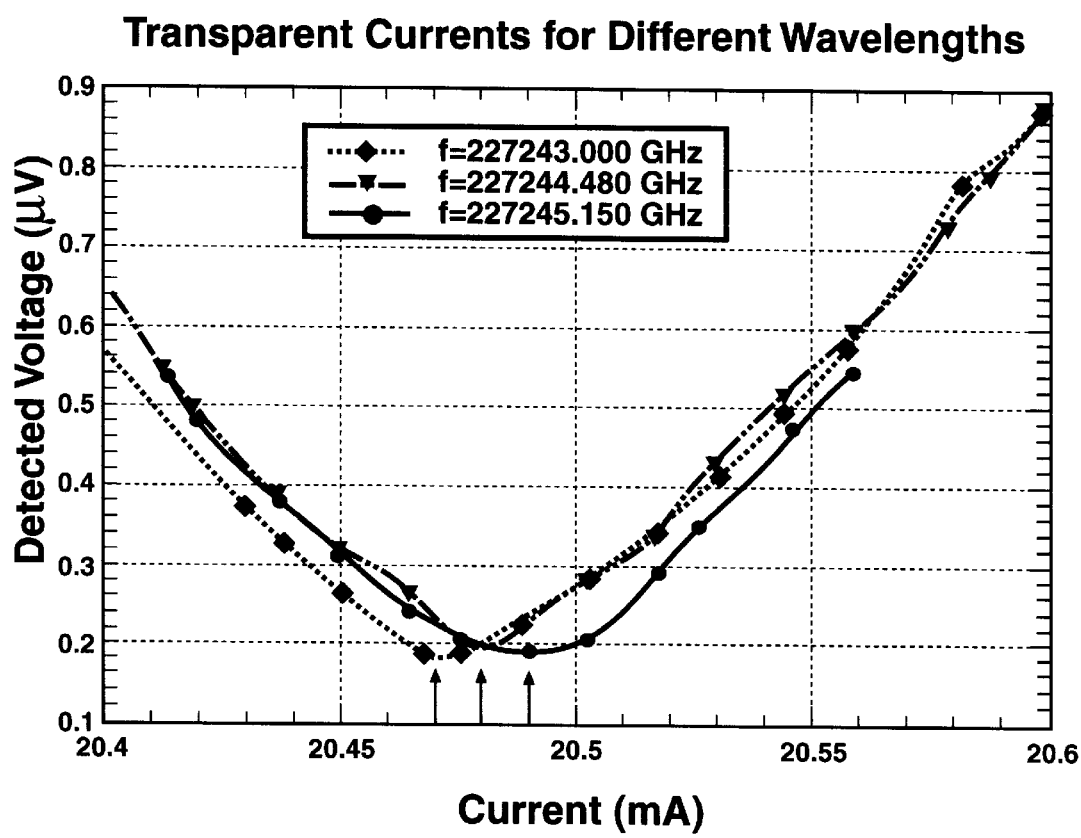

FIG. 4: The relation of the measured transparent current with frequency (wavelength) and temperature.

Figure 5:
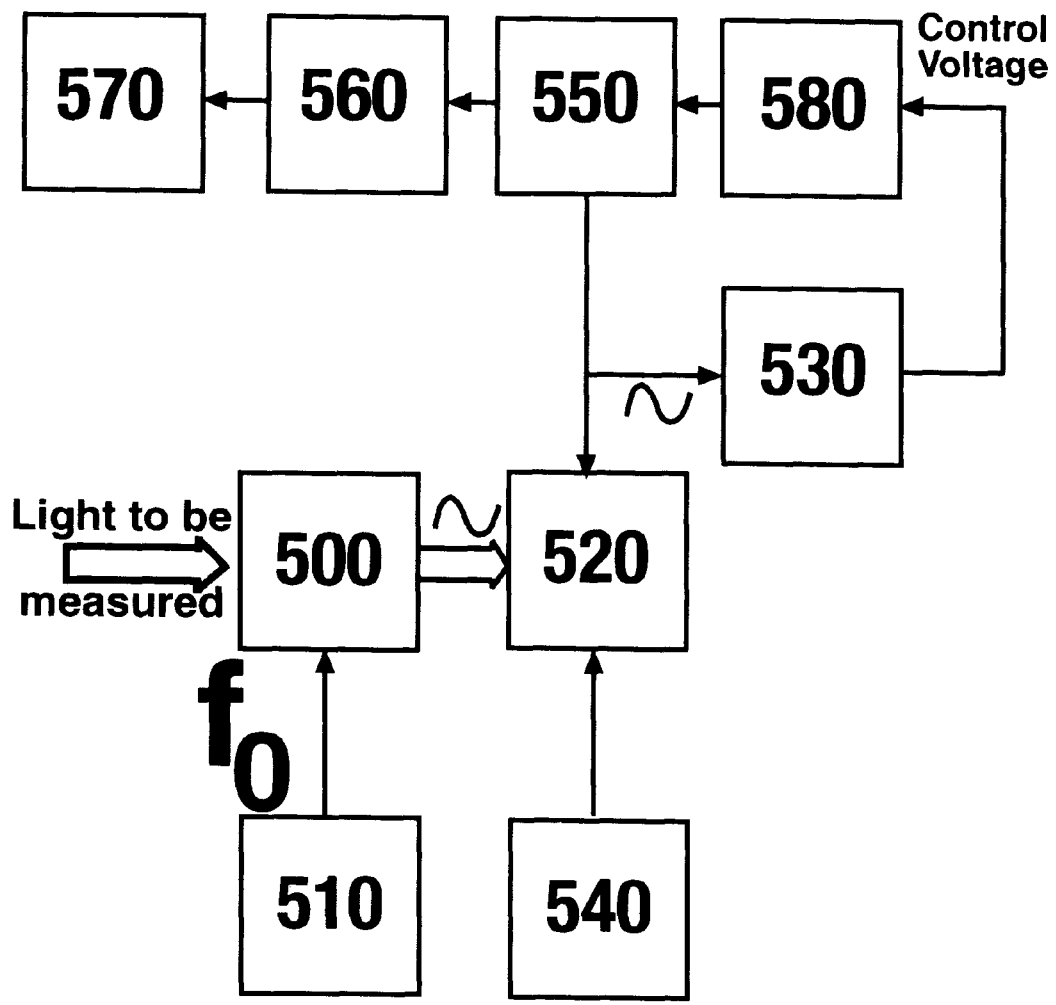

FIG. 5: The block diagram of the structure of the device in embodiment of the present invention in which semiconductor laser amplifier is used as wavelength sensor.

Figure 6:
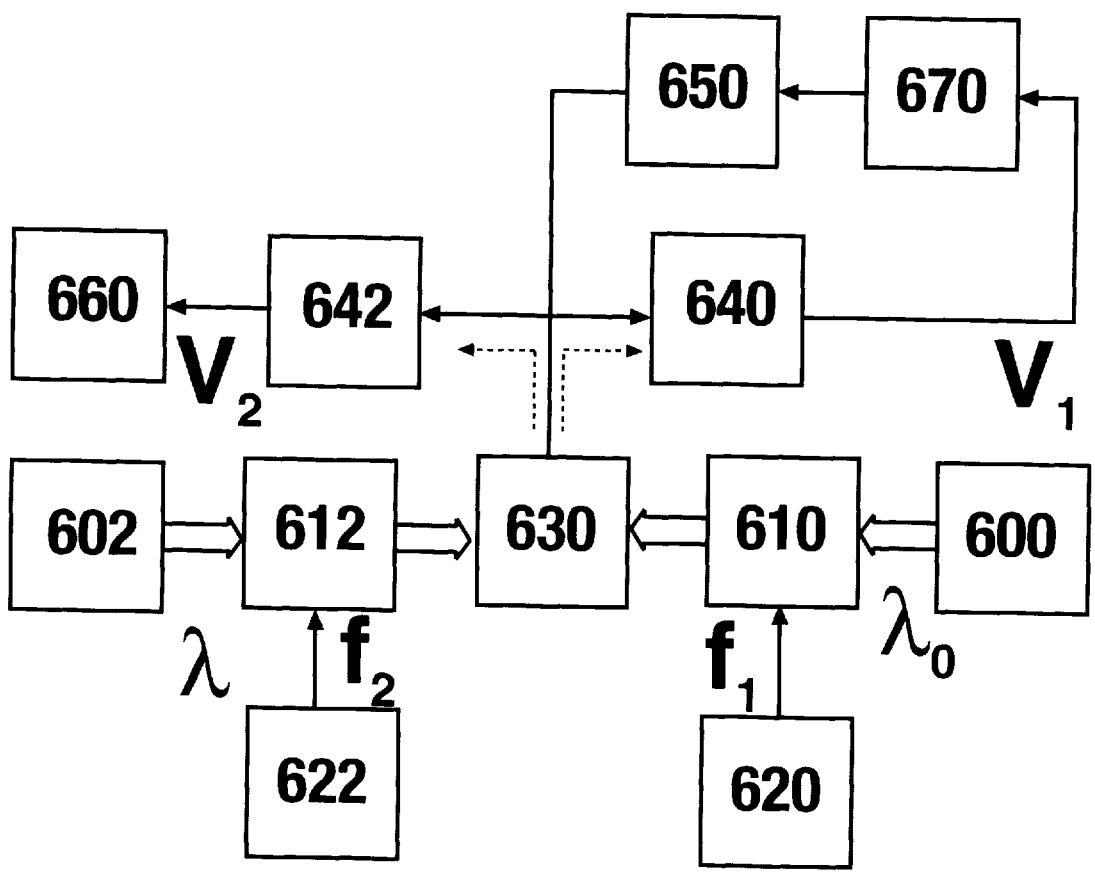

FIG. 6: The block diagram of the structure of the device in another embodiment of the present invention in which semiconductor laser amplifier is used as wavelength tracker.

Figure 7:
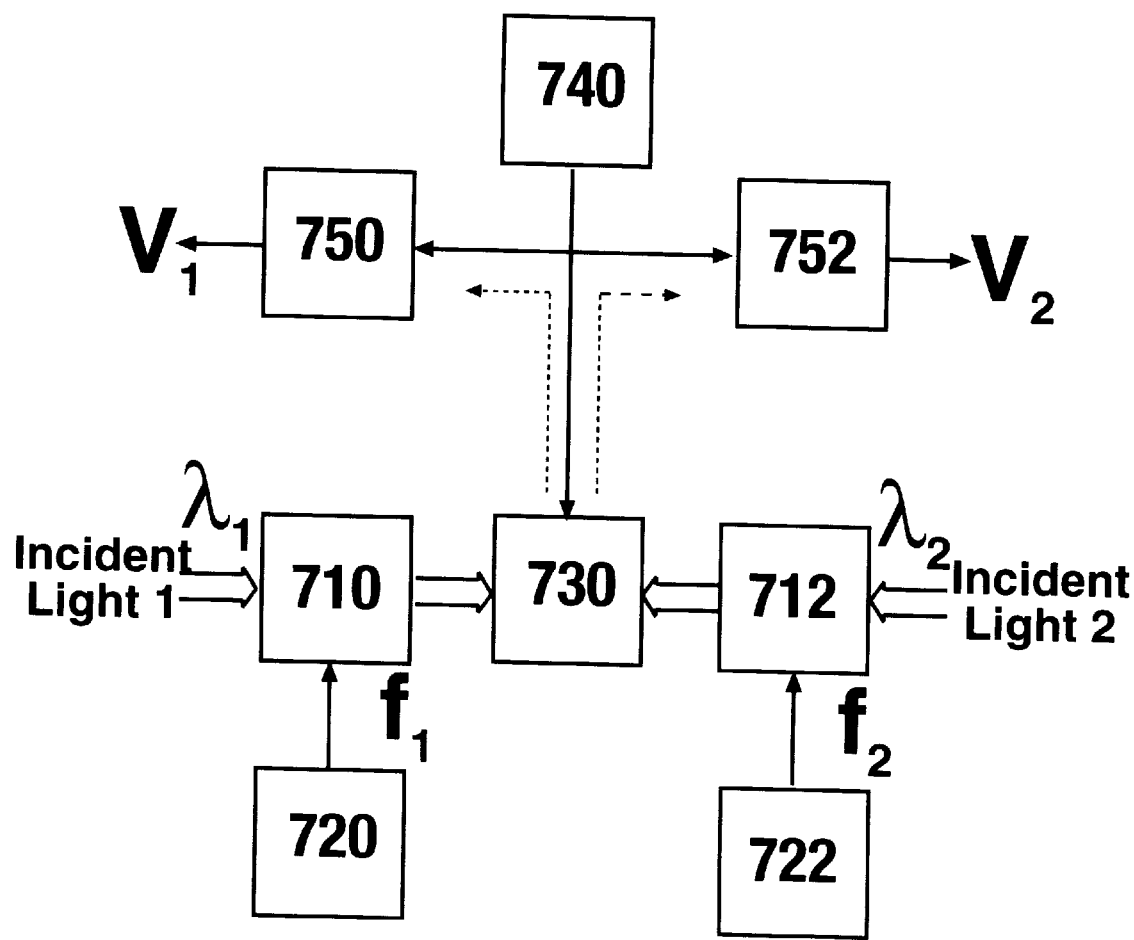

FIG. 7: The block diagram of the structure of the device in another embodiment of the present invention in which semiconductor laser amplifier is used as wavelength comparator.

Figure 8:
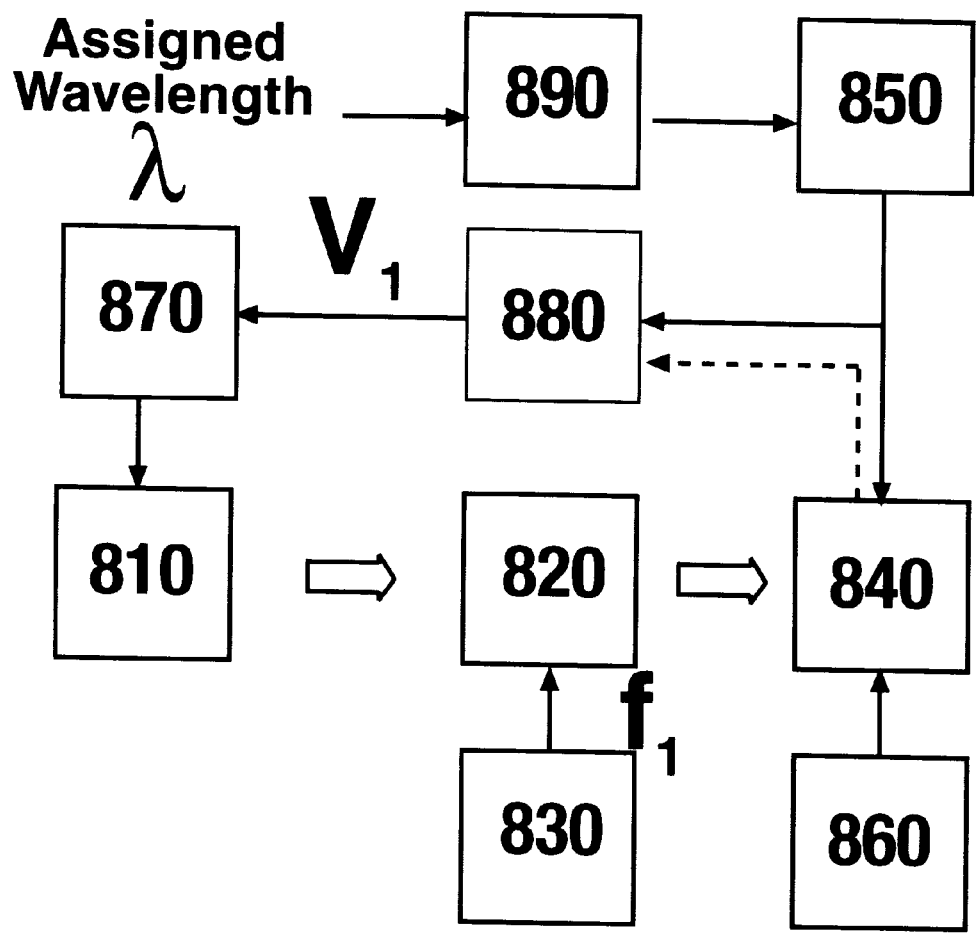

FIG. 8: The block diagram of the structure of the device in another embodiment of the present invention in which semiconductor laser amplifier is used as wavelength controller and stabilizer.

Reference Numbers Of The Attached Drawings:
- optical modulator . . . 210, 500, 610, 612, 710, 712
- semiconductor laser amplifier . . . 220, 520, 630, 730, 840, 820
- electronic amplifier and filter . . . 530
- electronic amplifier and filter @ f1 . . . 880
- amplifier and filter . . . 230
- amplifier and filter 169 f1 . . . 640, 750
- amplifier and filter 169 f2 . . . 642, 752
- DC current source . . . 240, 550, 650, 740, 850
- control circuit . . . 580, 670,
- temperature control . . . 540, 860
- laser . . . 810
- table lookup or functional fitting . . . 560
- table lookup . . . 890
- wavelength display . . . 570
- laser tuning mechanism . . . 660
- laser to be controlled . . . 602
- wavelength tuning mechanism . . . 870
- sinusoidal signal source . . . 510, 620, 622, 720, 722, 830
- laser as reference light . . . 600

DESCRIPTION OF THE PREFERRED EMBODIMENTS

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

While there is shown and described the present preferred embodiment of the invention, it is to be distinctly understood that this invention is not limited thereto but may be variously embodied to practice within the scope of the following claims.

The present invention demonstrates the method of wavelength measurement and tracking by using a semiconductor laser amplifier (also called semiconductor optical amplifier), wherein the method of wavelength measurement and tracking by using a semiconductor laser amplifier comprises the following 5 steps:

(i) Providing bias voltage for SLA with a current source;

(ii) Fixing the temperature of said the SLA;

(iii) Coupling the incident laser light modulated by a single frequency sinusoidal signal into said the SLA;

(iv) Measuring the value of transparent current of the above SLA;

(v) Based on the value of transparent current, calculating the wavelength of the laser light by checking the lookup table or by interpolation.

The design of the method of the present invention that uses semiconductor laser amplifiers (SLAs) as wavelength discriminators can be classified into 4 categories based on its usage:

A) Wavelength measurement, comprising:

An optical modulator to include a single frequency sinusoidal signal into the incident light to be measured;

A sinusoidal signal source to provide the required signal of said the optical modulator;

A semiconductor laser amplifier to provide the voltage in response to the incident light inputted from said the optical modulator;

An electronic filter and amplifier circuit to process the voltage sensed by the SLA and generate a control signal;

A temperature control circuit which can fix the temperature of said the SLA;

A DC current source which is controlled by the output control signal of said the electronic filter and amplifier circuit, and its varying output current can provide the bias current required by said the SLA, it will generate the transparent current when the voltage signal is adjusted to be zero;

A lookup table or functional interpolation circuit to convert to the corresponding wavelength based on the transparent current generated by said the DC current source.

B) Wavelength stabilization of a laser, comprising:

A laser to provide the incident light;

An optical modulator to add the single frequency sinusoidal signal into said the incident light;

A sinusoidal signal source to provide the required signal of the optical modulator;

A semiconductor laser amplifier to provide the voltage in response to the signal of the incident light;

A DC current source with varying output current to provide the bias current required by said the SLA;

A temperature control circuit which can fix the temperature of said the SLA;

A wavelength adjusting mechanism of laser light to adjust the wavelength of the incident light outputted from said the laser by controlling the temperature or adjusting the laser mirror; and An electronic filter and amplifying circuit to process the induced voltage of said the SLA, and by adjusting said the dc current source so that the output of said the electronic filter is zero and fix the current to this value, and then based on the output AC voltage of said the electronic filter by said the laser wavelength adjusting mechanism to stabilize the laser wavelength.

C) Wavelength tracking, comprising:

The first laser light source as reference light to provide the reference wavelength;

The second laser light source which is used as the light to track the reference wavelength;

The first optical modulator to add the first-frequency sinusoidal signal into the output beam of said the first laser light;

The second optical modulator to add the second-frequency sinusoidal signal into said the output of the second laser light;

Two sinusoidal signal sources to provide the required sinusoidal signals to said the first optical modulator and said the second optical modulator, respectively;

A semiconductor laser amplifier to determine the wavelength of the light source to be measured;

Two sets of electronic filters and amplifying circuits to process the induced signals of the two incident beams of said the SLA to generate the first and second voltage;

A DC current source with varying output current to provide the bias current required by said the SLA based on processing said the first voltage, and minimize said the first voltage by adjusting said the bias current;

A wavelength adjusting mechanism of laser light to adjust the wavelength of said the second laser light source, and when said the second voltage is minimum, said the wavelength of the second laser light source is equal to the wavelength of said the first laser light source.

D) Wavelength comparison, comprising:

Two optical modulators to add two sinusoidal signals, each with different frequencies, into the first incident light and the second incident light of which the wavelengths are to be compared;

Two sinusoidal signal sources to provide the required sinusoidal signals of said the two optical modulators, respectively;

A semiconductor laser amplifier to provide the induced voltage in response to the signals of the first incident light and the second incident light;

A DC current source with varying output current to provide the bias current required by said the SLA;

Two sets of electronic filters and amplifying circuits to process the voltage in response to the first incident light and the second incident light of said the SLA; and output the first and the second voltage, so that the value of the first current and the second current with which the first and the second voltage are zero can be recorded; and also based on this to compare the corresponding wavelengths of the first and the second incident light.

The key concept of the present invention for which these methods and apparatus work is based on the variation of the transparent current of a SLA with the wavelength of an incident light and the ambient temperature. In an active semiconductor material, the gain provided by the incident light will increase with the increase of current. Since the stimulated absorption mechanism will occur at the same time in the active material, when the injected current increases from zero, the active medium will change gradually from absorption condition to amplifying condition. The corresponding current when the gain is zero is called the transparent current $I_{tr}$ which must satisfy:

$$\Delta E_{fc}(I_{tr}) + \Delta E_{fv}(I_{tr}) = \frac{hc}{\lambda} - E_g$$

$\Delta E_{fc}$: The energy separation between the quasi Fermi level of electrons to the bottom of conduction band $E_{fv}$: The energy separation between the quasi Fermi level of holes to the bottom of valence band h: Planck constant C: the speed of light $\lambda$: The wavelength of incident light Eg: bandgap energy The condition to reach the transparent condition is that the energy of the incident light equals the energy difference between the quasi Fermi level of electrons and the quasi Fermi level of holes. Since the quasi-Fermi levels vary with the injected current; the transparency is wavelength dependent and thus the transparent current varies with the incident wavelength.

Refer to FIG. 1 which shows the relation of the transparent current with the wavelength and temperature of InGaAsP material (energy gap 0.8 eV). This relation can be used to measure and control the wavelength. To measure or control the wavelength by transparent current, it is necessary to have a simple and accurate method to measure the transparent current. Theoretically, one can measure the injection current that corresponds to the situation when the gain is zero. But due to the problem in obtaining the input/output coupling coefficient, it is difficult to accurately measure the gain of light passing through the SLA.

When the bias to a gain material is above the transparent current, an increase of the input light will excite more recombination of carriers, which results in a reduction in the number of carriers, and thus reduces the energy separation between the quasi-Fermi levels of electrons and holes. Therefore, the voltage across the junction decreases, and this voltage variation can be detected from the external circuit. Conversely, if the bias voltage is below the transparent current, the material works in the absorptive situation, the input light will be absorbed by the material and generate extra carriers. Thus, an increase in the input light power gives rise to an increase in the number of carriers and then increases the energy separation between the quasi-Fermi levels of electrons and holes, so the voltage across the junction will increase. This voltage variation can be measured from the external circuit. Hence when the injection current increases from below the transparent current to above the transparent current, the detected voltage across the diode junction will change from a positive value to a negative value. The corresponding injection current at which the voltage goes to zero is the transparent current. Therefore, one can easily and accurately measure the transparent current with the method shown in FIG. 2.

Refer to FIG. 2, by using an optical modulator 210 to add the AC signal into the incident light, the signal will appear on the junction voltage of the semiconductor laser amplifier 220. After this voltage passes through the filter and amplifier 230, the noise is eliminated and the voltage is amplified, which can be used to adjust the bias of SLA 220. DC current source 240 is used to provide the required bias current of SLA 220. When the output AC voltage signal is zero, the bias current of SLA at this time is the transparent current.

Although P. A. Anderekson et al. in *Electronics Letters* (Vol. 28, No. 2, pp. 171–172,1992) have already used the way similar to FIG. 2 to measure the transparent current in the prior technology, the method of using transparent current to measure or control the wavelength of laser light is never known in the prior technology.

FIG. 3 shows the relation of the measured transparent current with wavelength and temperature of the SLA (Phillips CQF882/E). When the wavelength is 1310 nm at room temperature, the variation of transparent current with wavelength and temperature is about −0.6 mA/nm and 0.6 mA/° C., respectively. The accuracy of using the method of the present invention for wavelength discrimination is determined by the resolution of the output current source, the stability of temperature control, and the noise of the sensed voltage. In general, most of the noise can be filtered out by narrow band-pass filter; the stability of regular temperature control circuit or control instrument can be below 0.01° C., so the variation of the transparent current due to the temperature variation can be controlled to be below 6 ?A. Thus, the corresponding error of the wavelength measurement can be controlled within 0.01 nm (0.1 Å). By the same argument, if the resolution of the output current source is better than 6 ?A, the error of wavelength measurement can also be controlled below 0.01 nm. From the above analysis, quite high accuracy can be obtained by using this method for wavelength discrimination and it has been proven by the experiment. As shown in FIG. 4, when the resolution of the output current source is 8?A and the difference of laser wavelength is 2.15 GHz (corresponds to 0.12 Å wavelength spacing), the difference in the transparent current can clearly be seen. The order of magnitude of the resolution meets the requirement of optical fiber networks.

The method of wavelength measurement and tracking of the present invention by using a semiconductor laser amplifier includes the following steps: use a current source to provide bias current of SLA; fix the temperature of said SLA; shine laser light modulated by a single frequency sinusoidal signal to said SLA; measure the transparent current of said SLA; based on the value of SLA, check the table to find the wavelength of laser light.

In summary, the present invention provides several economic and efficient ways to measure and control the wavelength in electro-optic systems and optical fiber networks. These new methods and the devices made by these new methods can resolve the difficult problems of the electro-optic instrument for the display of wavelength, and can overcome the problem of the wavelength drift for single frequency lasers or wavelength-tunable lasers in optical networks. They will promote the widespread usage of these lasers and lead the development of optical fiber networks toward a more practical and higher-speed stage.

To further describe the method, structure, and advantages of the present invention, the attached figures are described with embodiments of the present invention as follows:

By utilizing the property that the transparent current of a SLA varies with the wavelength of an incident light as well as the temperature, and varies with the usage of the transparent property, one can design devices with various functions as the following:

(A) wavelength measurement apparatus: the light of which the wavelength is to be measured is coupled into a SLA. A signal is generated to control current source after filtering and amplifying the generated AC voltage across the two terminals of the diode. Adjust the current source so that the AC signal is zero, the value of current at this time is called the transparent current. The wavelength of the light to be measured can be obtained by checking the built-in lookup table or obtained from the relation between the transparent current and wavelength.

Refer to FIG. 5, the device of the present invention for wavelength measurement by using a semiconductor laser amplifier, comprising:

An optical modulator 500 to include a single frequency sinusoidal signal into the incident light to be measured;

A sinusoidal signal source 510 to provide the required signal of said the optical modulator;

A semiconductor laser amplifier 520 to provide the voltage in response to the incident light inputted from said the optical modulator 500;

An electronic filter and amplifier circuit 530 to process the voltage sensed by the SLA 520 to generate a control signal;

A temperature control circuit 540 which can fix the temperature of said the SLA 520;

A DC current source 550 which is controlled by the outputted control signal of the control circuit, and its varying output current can provide the bias current required by said the SLA 520, it will generate the transparent current when the current signal is adjusted to be zero;

A control circuit 580 to adjust the DC current source 550 based on the outputted control signal of said the electronic filter and amplifier circuit 530;

A lookup table 560 to convert to the corresponding wavelength based on the transparent current generated by said the DC current source 550 and display the wavelength on the display device 570.

(B) wavelength tracking apparatus which can adjust the output wavelength of laser to be the same as that of the other reference beam. It is operated by modulating the light source to be adjusted and the reference light with different frequencies of AC sinusoidal signal sources, and coupling both of them into laser amplifier via the same or different facet. Since the modulation frequency is different, so the sensed AC voltage for the two light sources will appear at the output of different filters, say $V_2$ for the light to be adjusted and $V_1$ for the reference light. Adjust DC current source such that $V_1$ is minimum, the bias current of laser amplifier at this time is the transparent current relative to the reference wavelength. Use $V_2$ to change the wavelength adjusting mechanism of the laser. When its wavelength is closer to the reference wavelength, $V_2$ becomes smaller, and conversely it will get larger. When $V_2$ is adjusted to be minimum, the output light of the adjusted light source will have the same wavelength with the reference light.

Refer to FIG. 6, the device of the present invention for wavelength measurement and tracking by using a semiconductor laser amplifier, when used as a wavelength tracking apparatus, comprising:

The first laser light source 600 as reference light to provide the reference wavelength $\lambda_0$.

The second laser light source 602 of which the wavelength $\lambda$ is to be adjusted to track the reference wavelength $\lambda_0$;

The first optical modulator 610 to add the first sinusoidal signal 620 of frequency $f_1$ into the output beam of said the first laser light source 600;

The second optical modulator 612 to add the second sinusoidal signal 622 of frequency $f_2$ into said the output of the second laser light 602;

Two sinusoidal signal source 620, 622 to provide the required sinusoidal signals to said the first optical modulator 610 and said the second optical modulator 612, respectively;

A semiconductor laser amplifier 630 to provide the induced junction voltage in response to the signals of the incident light from the first laser light source 600 and the second laser light source 602;

Two sets of electronic filter and amplifying circuits 640, 642 to process the induced voltage signal of said the SLA 630 and generate the first voltage VI and the second voltage $V_2$;

A DC current source 650 with varying output current to provide the bias current for the SLA 630;

A control circuit 670 to adjust the bias current required by the output of said the SLA 630 based on processing said the first voltage $V_1$, and minimize said the first voltage $V_1$ by adjusting said the bias current;

A wavelength adjusting mechanism 660 of laser light to adjust the wavelength $\lambda$ of said the second laser light source $V_2$ by controlling the temperature or laser mirror, and when said the second voltage $V_2$ is minimum, said the wavelength $\lambda$ of the second laser light source is equal to the wavelength $\lambda_0$ of said the first laser light source.

(C) wavelength comparator for comparing the wavelengths of two incident light by measuring their corresponding transparent currents. It may be operated in two modes:

1) Adjust the DC current source and measure the output voltage signal $V_1$ and $V_2$, record the value of current $I_1$ and $I_2$ when $V_1$ and $V_2$ are zero. When $I_1 < I_2$, then $\lambda_1 > \lambda_2$; otherwise if $I_1 > I_2$, then $\lambda_1 < \lambda_2$; when $I_1 = I_2$, then $\lambda_1 = \lambda_2$;

2) Adjust DC current source so that $V_1 = 0$, the wavelength of two incident beams can be compared from the phase of $V_2$.

Refer to FIG. 7, the device of the present invention for wavelength measurement and tracking by using a semiconductor laser amplifier, when used as the wavelength comparator, comprising:

Two optical modulators 710, 712, to add two sinusoidal signals, each with different frequencies, into the first incident light and the second incident light of which the wavelengths are to be compared;

Two sinusoidal signal sources 720, 722, to provide the required sinusoidal signals of said the two optical modulators 710, 712;

A semiconductor laser amplifier 730 to provide the induced voltage in response to the signals of the first incident light and the second incident light;

A DC current source 740 with varying output current to provide the bias current required by said the SLA 730;

Two sets of electronic filters and amplifying circuits 750, 752 to process the voltage in response to the first incident light and the second incident light of said the SLA 730; and output the first and the second voltages, so that the value of the first current and the second current with which the first and the second voltage are zero can be recorded; and also based on this to compare the corresponding wavelengths of the first and the second incident light.

(D) wavelength stabilizer or controller of laser:

1) wavelength stabilizer: turn on the laser, adjust the DC power supply so that the output of the filter is zero, fix the current at this value, if the wavelength of laser drifts, the output terminal of filter will generate an AC voltage, adjust the wavelength control mechanism (the temperature of laser or current) based on this voltage to stabilize the wavelength.

2.) wavelength controller: based on the preset wavelength, check the lookup table to find the transparent current corresponding to the wavelength, set the output of the DC power supply at this value, adjust the wavelength control mechanism by using the output voltage of the filter to modify the wavelength of laser until the output voltage is zero, the preset wavelength is the laser wavelength at this time.

Refer to FIG. 8, the device of the present invention for wavelength measurement and tracking by using a semiconductor laser amplifier, when used as wavelength stabilizer, comprising:

A laser 810 to provide the incident light;

An optical modulator 820 to add the single frequency sinusoidal signal into said the incident light;

A sinusoidal signal source 830 to provide the sinusoidal signal required by said the optical modulator 820;

A semiconductor laser amplifier 840 to provide the induced voltage in response to the signal of the incident light;

A DC current source 850 with varying output current to provide the bias current required by said the SLA 840;

A temperature control circuit 860 which can fix the temperature of said the SLA 840;

A wavelength adjusting mechanism 870 of the laser to adjust the wavelength of the incident light outputted from said the laser 810 by controlling the temperature or adjusting the laser mirror; and An electronic filter and amplifying circuit 880 to process the induced voltage of said the SLA, and by adjusting said the DC current source so that the output of said the electronic filter is zero and fix the current to this value, and then based on the output AC voltage of said the electronic filter by said the laser wavelength adjusting mechanism to stabilize the laser wavelength.

The device of the present invention for wavelength measurement and tracking by using a semiconductor laser amplifier, when used as wavelength controller, comprising a lookup table 890 in addition to said the above structure to convert the preset wavelength into the bias current of the corresponding SLA for controlling the wavelength of said the laser. This structure allows the wavelength to be set up externally.

Said the lookup table 560 or 890 can be replaced by a functional interpolation circuit.

From the above, the method and device of the present invention for wavelength measurement and tracking by using a semiconductor laser amplifier has the following advantages: (1) low cost; (2) compact; (3) high accuracy; a primer experiment has proven that the accuracy can be better than 10 GHz (or 0.8 Å); (4) high reliability: can avoid the extra light coupling problem if integrated with the laser to be measured or controlled; (5) fast speed: the measurement time can be less than 1 ?s; (6) can be monolithically integrated with semiconductor optoelectronic devices. Furthermore, the features of the present invention are as follows: (1) the wavelength measurement apparatus or display by using a semiconductor laser amplifier can be used in elector-optic instrument or optical fiber networks to detect or indicate the wavelength used in the instrument or networks. (2) the wavelength tracker by using a semiconductor laser amplifier can be used in optical fiber network or other electro-optic instrument so that the wavelength of the laser light source will vary with the reference wavelength of the instrument or networks. (3) the wavelength comparator by using a semiconductor laser amplifier can be used in elector-optic instrument or optical fiber networks to compare the wavelength of the two optical signals. (4) the wavelength controller or stabilizer by using a semiconductor laser amplifier can be used in elector-optic instrument or optical fiber network to stabilize or control the wavelength of the laser light source.

From the foregoing description, it will be apparent that various changes may be made without departing from the spirit and scope of the invention as defined by the following claims.

I claim:

1. A method of wavelength measurement and tracking by using a semiconductor laser amplifier, which comprising the following 5 steps:

a.) Provide bias voltage for SLA from a current source;

b.) Fix the temperature of said the SLA;

c.) Shine incident laser light modulated with a single frequency sinusoidal signal into said the SLA;

d.) Measure the value of transparent current of the above SLA;

e.) Based on the value of transparent current, calculate the wavelength of the laser light by checking a lookup table or a functional interpolation circuit.

2. The method of claim 1, further comprising: using said the laser light as the reference light, shine another laser light of which the wavelength is to be tuned, and modulate this light by a single frequency sinusoidal signal to said SLA; the output from the electronic amplifier and filter is a voltage signal after processing the junction voltage of said the SLA, use this voltage signal to control a control mechanism of laser wavelength to adjust the laser wavelength to be tuned, when the voltage signal is minimum, the laser wavelength to be measured equals that of the reference laser light.

3. The method of claim 1, wherein said the value of the transparent current which corresponds to the preset wavelength of the laser light, can be inputted to said the current source by checking the lookup table to provide the bias current for said the SLA; and then use the output voltage of the filter to control the laser wavelength adjusting mechanism, and adjust the laser wavelength until the output voltage is zero.

4. The method of claim 1, wherein said the lookup table can be replaced by a functional interpolation circuit.

5. A apparatus which uses semiconductor laser amplifier (SLA) for wavelength measurement and tracking for measuring the wavelength, comprising:

an optical modulator to include a single frequency sinusoidal signal into the incident light to be measured;

a sinusoidal signal source to provide the required signal of said the optical modulator;

a semiconductor laser amplifier to provide the voltage in response to the incident light inputted from said the optical modulator;

an electronic filter and amplifier circuit to process the voltage induced across the junction of the SLA and generate a control signal;

a temperature control circuit which can fix the temperature of said the SLA;

a DC current source which is controlled by the output control signal of said the electronic filter and amplifier circuit, and its varying output current can provide the bias current required by said the SLA, it will generate the transparent current when the voltage signal is adjusted to be zero;

a lookup table or functional interpolation circuit to convert to the corresponding wavelength based on the transparent current generated by said the DC current source.

6. A device which uses semiconductor laser amplifier (SLA) for wavelength measurement and tracking to stabilize the wavelength, comprising:

a laser to provide the incident light;

an optical modulator to add the single frequency sinusoidal signal into said the incident light;

a sinusoidal signal source to provide the required signal of said the optical modulator;

a semiconductor laser amplifier to provide the induced voltage in response to the signal of the incident light;

a DC current source with varying output current to provide the bias current required by said the SLA;

a temperature control circuit which can fix the temperature of said the SLA;

a wavelength adjusting mechanism of laser light to adjust the wavelength of the incident light outputted from said the laser by controlling the temperature or adjusting the laser mirror; and an electronic filter and amplifying circuit to process the sensed voltage of said the SLA, and by adjusting said the dc current source so that the output of said the electronic filter is zero and fix the current to this value, and then adjust said the laser wavelength adjusting mechanism to stabilize the laser wavelength so that the output AC voltage of said the electronic filter is always zero.

7. A device which uses semiconductor laser amplifiers (SLAs) for wavelength measurement and tracking to track the wavelength, comprising:

the first laser light source as reference light to provide the reference wavelength;

the second laser light source of which the wavelength is to be adjusted to track the reference wavelength;

the first optical modulator to add the first-frequency sinusoidal signal into the output beam of said first laser light;

the second optical modulator to add the second-frequency sinusoidal signal into said output of the second laser light;

two sinusoidal signal sources to provide the required sinusoidal signal to said first optical modulator and said second optical modulator respectively;

a semiconductor laser amplifier to determine the wavelength of the light source to be measured;

two sets of electronic filters and amplifying circuits to process the amplified signal of the incident beam of said SLA to generate the first and second voltages;

a DC current source with varying output current to provide the bias current required by said the SLA based on processing said the first voltage, and minimize the said first voltage by adjusting the said bias current; and a wavelength adjusting mechanism of laser light to adjust the wavelength of the said second laser light source, and when said the second voltage is minimum, the said wavelength of the second laser light source is equal to the wavelength of the said first laser light source.

8. A device which uses semiconductor laser amplifiers (SLAs) for wavelength measurement and tracking to compare the wavelength, comprising:

two optical modulators to add two sinusoidal signals, each with a different frequency, into the first incident light and the second incident light of which the wavelengths are to be compared;

two sinusoidal signal sources to provide the required sinusoidal signals of said the two optical modulators, respectively;

a semiconductor laser amplifier to provide the induced voltage in response to the signal of the first incident light and the second incident light;

a DC current source with varying output current to provide the bias current required by said the SLA;

two sets of electronic filters and amplifying circuits to process the voltage in response to the first incident light and the second incident light of said the SLA; and output the first and the second voltage, so that the value of the first current and the second current with which the first and the second voltage are zero can be recorded; and also based on this to compare the corresponding wavelengths of the first and the second incident light.

9. The method of claim 6, further comprises a lookup table or functional interpolation circuit to convert the preset wavelength to the corresponding bias current of the SLA to control the wavelength of said the SLA, this structure allows the laser wavelength to be externally set.

10. The method of claim 6, wherein said the light to be measured comes from a semiconductor laser, further comprises an integrated optoelectronic device which consist of the semiconductor laser amplifier, optical modulator and the wavelength-stabilizing laser device.

11. Any one of the methods from claim 1 till claim 4, wherein said the semiconductor laser amplifier can also be called semiconductor optical amplifier, which can be any discrete device made by a semiconductor gain material or portions of optical integrated circuits.

12. Any one of the methods from claim 1 till claim 4, wherein said DC current source can be replaced by a DC voltage source to provide a fixed voltage to the semiconductor laser amplifier, the intensity variation of the incident light will excite an AC current signal across the diode junction of the semiconductor laser amplifier, which can be used to calculate the transparent current of the semiconductor laser amplifier after being processed by the electronic filter and amplifier circuits.

13. Any one of the methods from claim 5 till claim 8, wherein said electronic filter and amplifier circuits can be a lock-in amplifier or equipment with the function of filtering and amplification.

14. Any one of the methods from claim 5 to claim 8, wherein said optical modulator can be an optical chopper, a device or equipment which can impose intensity variation to light signals.

15. Any one of the methods from claim 5 to claim 8, wherein said optical modulator can be eliminated, and the output of the sinusoidal signal can be directly applied to the semiconductor laser to be controlled or stabilized.

16. Any one of the methods from claim 5 to claim 8, wherein said sinusoidal signal can be AC periodic or pulsed signal source.

17. Any one of the methods from claim 7 to claim 8, wherein said two incident beams can enter the SLA from the same or opposite facet; when the two incident beams input from the same facet, the two incident beams may be combined by a device like an optical coupler, optical combiner, or wavelength multiplexing device, and then coupled into the SLA; when the two incident beams input from opposite facets, the device comprises one or two optical isolators at both sides of the SLA or neighbors the laser light source to avoid that the reflected beam affects the output of laser.

18. The methods of claim 8, wherein said the wavelength comparator can compare more than two incident beams.

19. Any one of the methods from claim 1 to claim 4, wherein said the SLAs include devices with vertical-cavity surface emitted structure or edge emitted one.

20. Any one of the methods from claim 5 to claim 8, wherein said the control circuit between said the electronic filter and amplifier circuit and the DC current source can be replaced by manually adjusting the output current of the current source based on the control signal.

21. Any one of the methods from claim 5 to claim 8, wherein said the semiconductor laser amplifier can also be called semiconductor optical amplifier, which can be an isolated device made by semiconductor gain materials or one portion of an optical integrated circuit.

22. Any one of the methods from claim 5 to claim 8, wherein the SLAs include devices with vertical-cavity surface emitted one.

23. Any one of the methods from claim 5 to claim 8, wherein the DC current source can be replaced by a constant voltage source to provide a fixed voltage to the semiconductor laser amplifier, the intensity variation of the incident light will excite an AC current signal on the electrode of the semiconductor laser amplifier which can be used to calculate the transparent current of the semiconductor laser amplifier after being processed by the electronic filter and amplifier circuits.

* * * * *